(12) United States Patent
Tajalli et al.

(10) Patent No.: US 10,242,749 B2
(45) Date of Patent: Mar. 26, 2019

(54) CALIBRATION APPARATUS AND METHOD FOR SAMPLER WITH ADJUSTABLE HIGH FREQUENCY GAIN

(71) Applicant: Kandou Labs, S.A., Lausanne (CH)

(72) Inventors: Armin Tajalli, Chavannes près Renens (CH); Ali Hormati, Ecublens Vaud (CH)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 15/494,435

(22) Filed: Apr. 21, 2017

(65) Prior Publication Data

US 2017/0309346 A1    Oct. 26, 2017

Related U.S. Application Data

(60) Provisional application No. 62/328,734, filed on Apr. 28, 2016, provisional application No. 62/326,593, filed on Apr. 22, 2016.

(51) Int. Cl.
*G11C 27/02*    (2006.01)
*H03K 5/01*    (2006.01)
(Continued)

(52) U.S. Cl.
CPC .............. *G11C 27/02* (2013.01); *H03K 5/01* (2013.01); *H03K 19/21* (2013.01); *H04L 7/033* (2013.01); *H03K 2005/00013* (2013.01)

(58) Field of Classification Search
None
See application file for complete search history.

(56) References Cited

U.S. PATENT DOCUMENTS 3,824,494 A    7/1974    Wilcox
5,017,924 A    5/1991    Guiberteau
(Continued)

FOREIGN PATENT DOCUMENTS

CN    1864346    11/2006
EP    1926267    5/2008
WO    2005002162    1/2005

OTHER PUBLICATIONS

Giovaneli, et al., "Space-frequency coded OFDM system for multi-wire power line communications", Power Line Communications and Its Applications, 20015 International Symposium on Vancouver, BC, Canada, Apr. 6-8, 2005, Piscataway, NJ, pp. 191-195.

(Continued)

*Primary Examiner* — Cassandra Cox
(74) *Attorney, Agent, or Firm* — Invention Mine LLC

(57) ABSTRACT

Methods and systems are described for receiving a sampling signal, pre-charging a pair of output nodes prior to a sampling interval, initiating the sampling interval by enabling a current source according to a first transition of the received sampling signal, generating a differential output voltage at the pair of output nodes by discharging the pair of output nodes according to a differential input signal, the pair of output nodes discharged according to current drawn by the current source during the sampling interval, terminating the sampling interval by disabling the current source in response to a second transition of the received sampling signal, and inhibiting a recharge of the pair of output nodes for a hold time after termination of the sampling interval and prior to initiation of a subsequent sampling interval.

20 Claims, 12 Drawing Sheets

(51) Int. Cl.
*H03K 19/21* (2006.01)
*H04L 7/033* (2006.01)
*H03K 5/00* (2006.01)

(56) References Cited

U.S. PATENT DOCUMENTS

| | | | |
|---|---|---|---|
| 5,510,736 A * | 4/1996 | Van de Plassche | G11C 27/026 327/74 |
| 5,748,948 A | 5/1998 | Yu | |
| 6,384,758 B1 * | 5/2002 | Michalski | G11C 27/026 327/94 |
| 6,396,329 B1 | 5/2002 | Zerbe | |
| 6,522,699 B1 | 2/2003 | Anderson | |
| 6,690,739 B1 | 2/2004 | Mui | |
| 6,772,351 B1 | 8/2004 | Werner | |
| 6,876,317 B2 | 4/2005 | Sankaran | |
| 6,993,311 B2 | 1/2006 | Li | |
| 7,176,823 B2 | 2/2007 | Zabroda | |
| 7,269,130 B2 | 9/2007 | Pitio | |
| 7,366,942 B2 | 4/2008 | Lee | |
| 7,613,234 B2 | 11/2009 | Raghavan | |
| 7,650,525 B1 | 1/2010 | Chang | |
| 7,768,312 B2 | 8/2010 | Hirose | |
| 8,295,336 B2 | 10/2012 | Lutz | |
| 8,305,247 B2 | 11/2012 | Pun | |
| 8,791,735 B1 | 7/2014 | Shibasaki | |
| 8,841,936 B2 | 9/2014 | Nakamura | |
| 9,059,816 B1 | 6/2015 | Simpson | |
| 9,300,503 B1 | 3/2016 | Holden | |
| 9,461,862 B2 | 10/2016 | Holden | |
| 9,479,369 B1 | 10/2016 | Shokrollahi | |
| 9,520,883 B2 | 12/2016 | Shibasaki | |
| 9,634,797 B2 | 4/2017 | Benammar | |
| 9,667,379 B2 | 5/2017 | Cronie | |
| 9,917,711 B2 | 3/2018 | Ulrich | |
| 2002/0149508 A1 | 10/2002 | Hamashita | |
| 2002/0158789 A1 | 10/2002 | Yoshioka | |
| 2002/0167339 A1 | 11/2002 | Chang | |
| 2002/0181607 A1 | 12/2002 | Izumi | |
| 2003/0016763 A1 * | 1/2003 | Doi | G11C 27/02 375/316 |
| 2003/0016770 A1 | 1/2003 | Trans | |
| 2003/0046618 A1 | 3/2003 | Collins | |
| 2003/0085763 A1 | 5/2003 | Schrodinger | |
| 2003/0160749 A1 | 8/2003 | Tsuchi | |
| 2003/0174023 A1 | 9/2003 | Miyasita | |
| 2003/0185310 A1 | 10/2003 | Ketchum | |
| 2003/0218558 A1 | 11/2003 | Mulder | |
| 2004/0027185 A1 | 2/2004 | Fiedler | |
| 2004/0146117 A1 | 7/2004 | Subramaniam | |
| 2004/0155802 A1 | 8/2004 | Lamy | |
| 2004/0161019 A1 | 8/2004 | Raghavan | |
| 2004/0169529 A1 | 9/2004 | Afghahi | |
| 2004/0170231 A1 | 9/2004 | Bessios | |
| 2005/0134380 A1 | 6/2005 | Nairn | |
| 2005/0195000 A1 | 9/2005 | Parker | |
| 2005/0201491 A1 | 9/2005 | Wei | |
| 2005/0220182 A1 | 10/2005 | Kuwata | |
| 2005/0270098 A1 | 12/2005 | Zhang | |
| 2006/0036668 A1 | 2/2006 | Jaussi | |
| 2006/0097786 A1 | 5/2006 | Su | |
| 2006/0103463 A1 | 5/2006 | Lee | |
| 2006/0140324 A1 | 6/2006 | Casper | |
| 2006/0159005 A1 | 7/2006 | Rawlins | |
| 2006/0232461 A1 | 10/2006 | Felder | |
| 2006/0233291 A1 | 10/2006 | Garlepp | |
| 2006/0291589 A1 | 12/2006 | Eliezer | |
| 2007/0001723 A1 | 1/2007 | Lin | |
| 2007/0002954 A1 | 1/2007 | Cornelius | |
| 2007/0009018 A1 | 1/2007 | Wang | |
| 2007/0030796 A1 | 2/2007 | Green | |
| 2007/0103338 A1 | 5/2007 | Teo | |
| 2007/0176708 A1 | 8/2007 | Otsuka | |
| 2007/0182487 A1 | 8/2007 | Ozasa | |
| 2007/0201546 A1 | 8/2007 | Lee | |
| 2007/0201597 A1 | 8/2007 | He | |
| 2007/0204205 A1 | 8/2007 | Niu | |
| 2007/0283210 A1 | 12/2007 | Prasad | |
| 2008/0012598 A1 | 1/2008 | Mayer | |
| 2008/0187037 A1 | 8/2008 | Bulzacchelli | |
| 2008/0192621 A1 | 8/2008 | Suehiro | |
| 2009/0090333 A1 | 4/2009 | Spadafora | |
| 2009/0115523 A1 | 5/2009 | Akizuki | |
| 2009/0154604 A1 | 6/2009 | Lee | |
| 2009/0195281 A1 | 8/2009 | Tamura | |
| 2009/0262876 A1 | 10/2009 | Arima | |
| 2009/0316730 A1 | 12/2009 | Feng | |
| 2010/0081451 A1 | 4/2010 | Mueck | |
| 2010/0148819 A1 | 6/2010 | Bae | |
| 2010/0156691 A1 | 6/2010 | Taft | |
| 2010/0235673 A1 | 9/2010 | Abbasfar | |
| 2010/0271107 A1 | 10/2010 | Tran | |
| 2010/0283894 A1 | 11/2010 | Horan | |
| 2010/0309964 A1 | 12/2010 | Oh | |
| 2011/0028089 A1 | 2/2011 | Komori | |
| 2011/0032977 A1 | 2/2011 | Hsiao | |
| 2011/0074488 A1 | 3/2011 | Broyde | |
| 2011/0103508 A1 | 5/2011 | Mu | |
| 2011/0228864 A1 | 9/2011 | Aryanfar | |
| 2012/0044021 A1 | 2/2012 | Yeh | |
| 2012/0082203 A1 | 4/2012 | Zerbe | |
| 2012/0133438 A1 | 5/2012 | Tsuchi | |
| 2012/0213299 A1 | 8/2012 | Cronie | |
| 2013/0010892 A1 | 1/2013 | Cronie | |
| 2013/0013870 A1 | 1/2013 | Cronie | |
| 2013/0088274 A1 | 4/2013 | Gu | |
| 2013/0106513 A1 | 5/2013 | Cyrusian | |
| 2013/0114519 A1 | 5/2013 | Gaal | |
| 2013/0114663 A1 | 5/2013 | Ding | |
| 2013/0129019 A1 | 5/2013 | Sorrells | |
| 2013/0147553 A1 | 6/2013 | Iwamoto | |
| 2013/0188656 A1 | 7/2013 | Ferraiolo | |
| 2013/0202065 A1 | 8/2013 | Chmelar | |
| 2013/0215954 A1 | 8/2013 | Beukema | |
| 2013/0259113 A1 | 10/2013 | Kumar | |
| 2013/0271194 A1 | 10/2013 | Pellerano | |
| 2013/0307614 A1 | 11/2013 | Dai | |
| 2013/0314142 A1 | 11/2013 | Tamura | |
| 2013/0315501 A1 | 11/2013 | Atanassov | |
| 2013/0346830 A1 | 12/2013 | Ordentlich | |
| 2014/0159769 A1 | 6/2014 | Hong | |
| 2014/0177645 A1 | 6/2014 | Cronie | |
| 2014/0177696 A1 | 6/2014 | Hwang | |
| 2014/0266440 A1 | 9/2014 | Itagaki | |
| 2014/0269130 A1 | 9/2014 | Maeng | |
| 2014/0286381 A1 | 9/2014 | Shibasaki | |
| 2015/0049798 A1 | 2/2015 | Hossein | |
| 2015/0070201 A1 | 3/2015 | Dedic | |
| 2015/0117579 A1 | 4/2015 | Shibasaki | |
| 2015/0198647 A1 | 7/2015 | Atwood | |
| 2015/0333940 A1 | 11/2015 | Shokrollahi | |
| 2015/0349835 A1 | 12/2015 | Fox | |
| 2015/0380087 A1 | 12/2015 | Mittelholzer | |
| 2015/0381232 A1 | 12/2015 | Ulrich | |
| 2016/0020796 A1 | 1/2016 | Hormati | |
| 2016/0020824 A1 | 1/2016 | Ulrich | |
| 2016/0036616 A1 | 2/2016 | Holden | |
| 2016/0197747 A1 | 7/2016 | Ulrich | |
| 2016/0261435 A1 | 9/2016 | Musah | |
| 2017/0310456 A1 | 10/2017 | Tajalli | |
| 2017/0317449 A1 | 11/2017 | Shokrollahi | |
| 2017/0317855 A1 | 11/2017 | Shokrollahi | |

OTHER PUBLICATIONS

Shibasaki, et al., "A 56-Gb/s Receiver Front-End with a CTLE and 1-Tap DFE in 20-nm CMOS", IEEE 2014 Symposium on VLSI Circuits Digest of Technical Papers, 2 pgs.

Hidaka, et al., "A 4-Channel 1.25-10.3 Gb/s Backplane Transceiver Macro With35 dB Equalizer and Sign-Based Zero-Forcing Adaptive

(56) References Cited

OTHER PUBLICATIONS

Control", IEEE Journal of Solid-State Circuits, vol. 44 No. 12, Dec. 2009, pp. 3547-3559.

* cited by examiner

CALIBRATION APPARATUS AND METHOD FOR SAMPLER WITH ADJUSTABLE HIGH FREQUENCY GAIN

CROSS REFERENCE TO RELATED APPLICATIONS

This application claims the benefit of U.S. Provisional Application Nos. 62/326,593, filed Apr. 22, 2016, entitled "SAMPLER WITH INCREASED WIDEBAND GAIN AND EXTENDED EVALUATION TIME", and U.S. Provisional Application No. 62/328,734 filed Apr. 28, 2016, entitled "CALIBRATION APPARATUS AND METHOD FOR SAMPLER WITH ADJUSTABLE HIGH FREQUENCY GAIN", both of which are hereby incorporated by reference in their entireties.

REFERENCES

The following prior applications are herein incorporated by reference in their entirety for all purposes:

U.S. Patent Publication 2011/0268225 of application Ser. No. 12/784,414, filed May 20, 2010, naming Harm Cronie and Amin Shokrollahi, entitled "Orthogonal Differential Vector Signaling" (hereinafter "Cronie I").

U.S. Patent Publication 2011/0302478 of application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II").

U.S. patent application Ser. No. 13/542,599, filed Jul. 5, 2012, naming Armin Tajalli, Harm Cronie, and Amin Shokrollhi entitled "Methods and Circuits for Efficient Processing and Detection of Balanced Codes" (hereafter called "Tajalli I".)

U.S. patent application Ser. No. 13/842,740, filed Mar. 15, 2013, naming Brian Holden, Amin Shokrollahi and Anant Singh, entitled "Methods and Systems for Skew Tolerance in and Advanced Detectors for Vector Signaling Codes for Chip-to-Chip Communication", hereinafter identified as [Holden I];

U.S. Provisional Patent Application No. 61/946,574, filed Feb. 28, 2014, naming Amin Shokrollahi, Brian Holden, and Richard Simpson, entitled "Clock Embedded Vector Signaling Codes", hereinafter identified as [Shokrollahi I].

U.S. patent application Ser. No. 14/612,241, filed Aug. 4, 2015, naming Amin Shokrollahi, Ali Hormati, and Roger Ulrich, entitled "Method and Apparatus for Low Power Chip-to-Chip Communications with Constrained ISI Ratio", hereinafter identified as [Shokrollahi II].

U.S. patent application Ser. No. 13/895,206, filed May 15, 2013, naming Roger Ulrich and Peter Hunt, entitled "Circuits for Efficient Detection of Vector Signaling Codes for Chip-to-Chip Communications using Sums of Differences", hereinafter identified as [Ulrich I].

U.S. patent application Ser. No. 14/816,896, filed Aug. 3, 2015, naming Brian Holden and Amin Shokrollahi, entitled "Orthogonal Differential Vector Signaling Codes with Embedded Clock", hereinafter identified as [Holden II].

U.S. patent application Ser. No. 14/926,958, filed Oct. 29, 2015, naming Richard Simpson, Andrew Stewart, and Ali Hormati, entitled "Clock Data Alignment System for Vector Signaling Code Communications Link", hereinafter identified as [Stewart I].

U.S. patent application Ser. No. 14/925,686, filed Oct. 28, 2015, naming Armin Tajalli, entitled "Advanced Phase Interpolator", hereinafter identified as [Tajalli II].

U.S. Provisional Patent Application No. 62/286,717, filed Jan. 25, 2016, naming Armin Tajalli, entitled "Voltage Sampler Driver with Enhanced High-Frequency Gain", hereinafter identified as [Tajalli III].

FIELD OF THE INVENTION

The present embodiments relate to communications systems circuits generally, and more particularly to obtaining an instantaneous measurement of a received signal voltage relative to a provided clock signal, as one component of detecting received communications signals from a high-speed multi-wire interface used for chip-to-chip communication.

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods have been proposed to further optimize the trade-offs between power consumption, pin efficiency and noise robustness of chip-to-chip communication systems. In those vector signaling systems, digital information at the transmitter is transformed into a different representation space in the form of a vector codeword that is chosen in order to optimize the power consumption, pin-efficiency and speed trade-offs based on the transmission channel properties and communication system design constraints. Herein, this process is referred to as "encoding". The encoded codeword is communicated as a group of signals from the transmitter to one or more receivers. At a receiver, the received signals corresponding to the codeword are transformed back into the original digital information representation space. Herein, this process is referred to as "decoding".

Regardless of the encoding method used, the received signals presented to the receiving device are sampled (or their signal value otherwise recorded) at intervals best representing the original transmitted values, regardless of transmission channel delays, interference, and noise. The timing of this sampling or slicing operation is controlled by an associated Clock and Data Recovery (CDR) timing system, which determines the appropriate sample timing.

Methods and systems are described herein for receiving a sampling signal, pre-charging a pair of output nodes prior to a sampling interval, initiating the sampling interval by enabling a current source according to a first transition of the received sampling signal, generating a differential output voltage at the pair of output nodes by discharging the pair of output nodes according to a differential input signal, the pair of output nodes discharged according to current drawn by the current source during the sampling interval, terminating the sampling interval by disabling the current source in response to a second transition of the received sampling signal, and inhibiting a recharge of the pair of output nodes for a hold time after termination of the sampling interval and prior to initiation of a subsequent sampling interval.

BRIEF DESCRIPTION

To reliably detect the data values transmitted over a communications system, a receiver accurately measures the received signal value amplitudes at carefully selected times. In some embodiments, the value of the received signal is first captured at the selected time using a known sample-and-hold or track-and-hold circuit (or known variants such as amplify-and-hold or integrate-and-hold), and then the resulting value is measured against one or more reference values using a known voltage comparator circuit. Other embodiments first use a comparator to "slice" the analog signal and obtain a digital result, then digitally sample the resulting binary value using a clocked digital latch.

Other embodiments utilize circuits capable of applying both the time- and amplitude-domain constraints, producing a result that represents the input value at a particular time and relative to a provided reference level. [Tajalli III] provides examples of such embodiments, in which the high frequency gain of the sampling circuit may be advantageously boosted over a narrow frequency range, in a so-called high frequency peaking action as graphically illustrated by the gain vs. frequency chart of FIG. 6A.

It is also possible to provide enhanced signal gain over a wide frequency range, as shown by the gain vs. frequency chart of FIG. 6B and described in the embodiments herein. Additional embodiments are described in which the clocked sampling action is further enhanced by reliance on dynamic circuit operation rather than the static mode of operation used in [Tajalli III].

DETAILED DESCRIPTION

To reliably detect the data values transmitted over a communications system, a communications receiver accurately measures its received signal value amplitudes at carefully selected times, typically at or near the center of that received signal's period of stability between transitions. This point is commonly described as the "center of eye", (referring to the well-known "eye diagram" of signal amplitude vs. clock intervals) and is typically determined by use of a local "receive clock" which is configured to occur at that desirable sampling time. Generation and ongoing control of such receive clock timing is well understood in the art, as Clock Data Alignment (CDA) systems measure and incrementally adjust sample timing versus receive signal stability time to optimize sample timing.

In some embodiments, the value of the received signal is first captured at the selected time using a sample-and-hold or track-and-hold circuit, and then the resulting value is measured against one or more reference values using a known voltage comparator circuit.

Figure 6A:
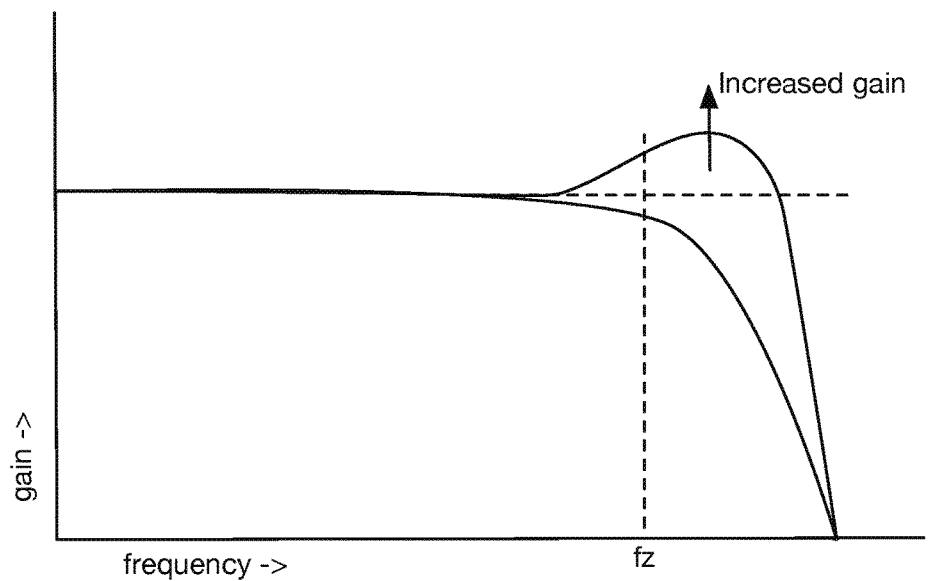
FIG. 6A is a gain vs. frequency plot showing high frequency "peaking" gain enhancement as provided by the circuit of FIG. 1.

Other embodiments utilize circuits capable of applying both the time- and amplitude-domain constraints, producing a result that represents the input value at a particular time and relative to a provided reference level. [Tajalli III] provides examples of such voltage sampler embodiments, in which the high frequency gain of the sampling circuit may be advantageously boosted over a narrow frequency range, in a so-called high frequency peaking action as graphically illustrated by the gain vs. frequency chart of FIG. 6A. Such high frequency peaking is particularly useful in receiver frequency compensation of communications channel characteristics. A further embodiment is described herein, in which the clocked sampling action is further enhanced by reliance on dynamic circuit operation rather than the static mode of operation used in [Tajalli III].

Figure 6B:
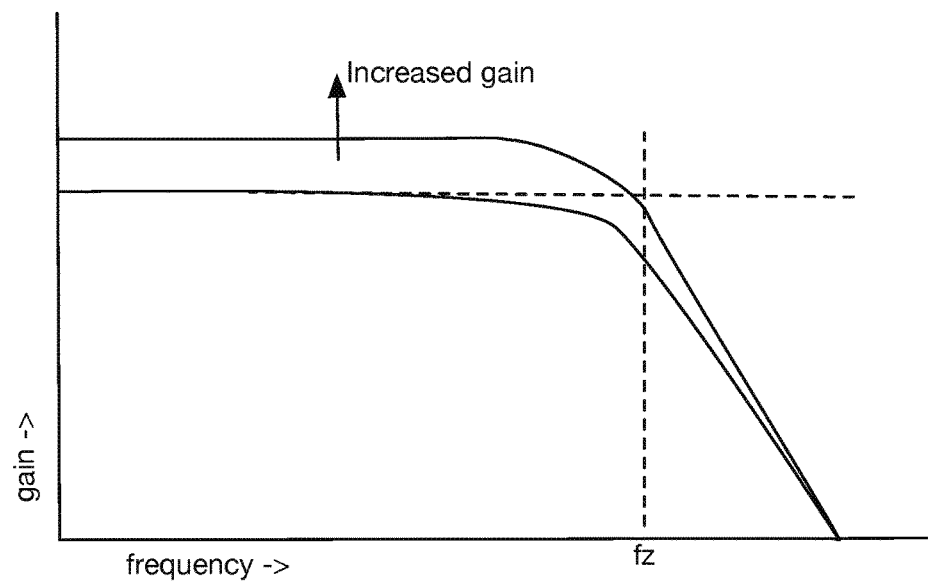
FIG. 6B is a gain vs. frequency plot showing wideband gain enhancement as provided by the circuit of FIG. 2.

Dynamic circuit operation may also be applied to wideband amplification to provide enhanced signal gain over a wide frequency range, as shown by the gain vs. frequency chart of FIG. 6B and described in embodiments herein.

Sampler with High Frequency Peaking

It is common for communications links to be operated at data transfer rates at or near the declining portion of the link's response vs. frequency curve. Thus, it is desirable for receivers to be configurable to provide additional high frequency gain, as compensation for the reduced response of the communications link.

Figure 1:
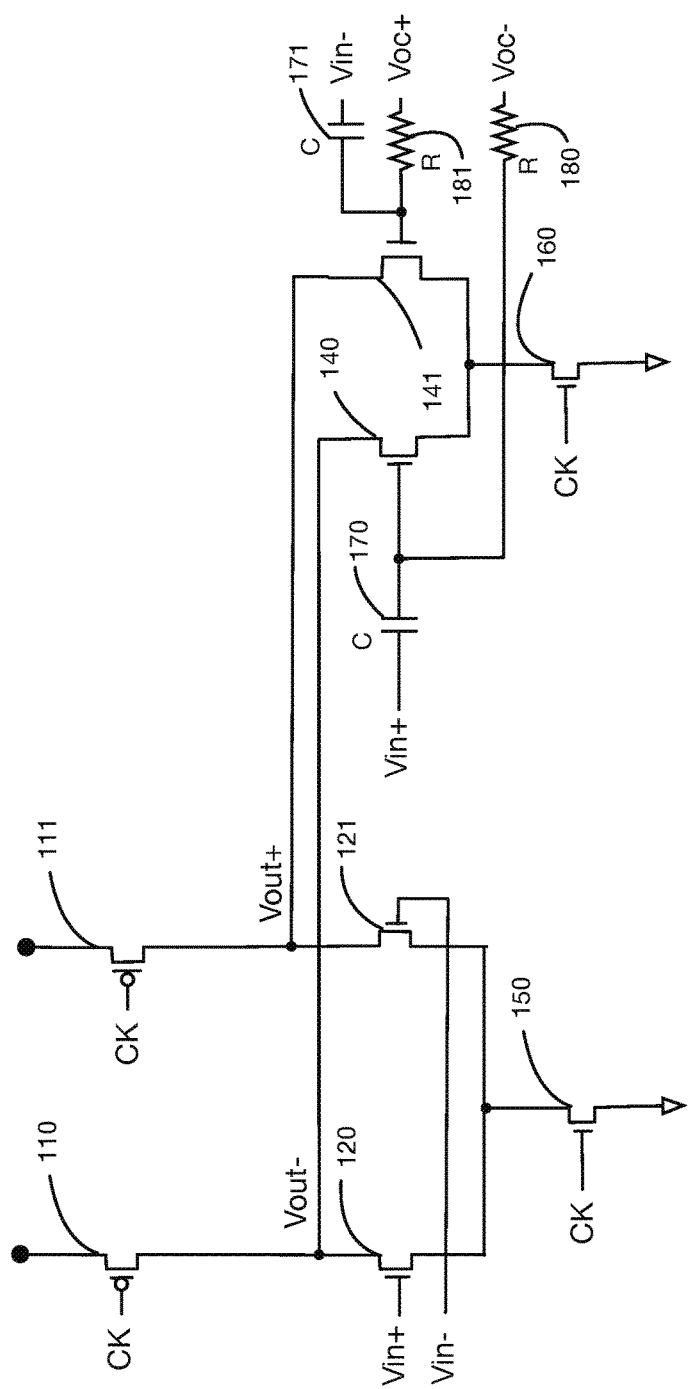
FIG. 1 is a schematic diagram of a voltage sampler with high frequency peaking and offset compensation.

[Tajalli III] provided one example of a sampler circuit capable of providing additional narrowband high frequency gain through use of a secondary gain path enabled by a frequency-selective RC network. The circuit of FIG. 1 provides another embodiment of this type with lower quiescent current draw, due to its reliance on dynamic switching mode in all transistors. Positive cycles of CK turn on transistors 110 and 111 pre-charging nodes Vout+ and Vout−, with the complementary or inverse phase of CK enables transistors 150 and 160, allowing those charges to flow through the differential transistor pairs 120/121 and 140/141 to ground, those momentary current flows being controlled by the voltage levels presented by inputs Vin+ and Vin−. Because of the non-overlap between charge sources and discharge sinks being on, this circuit draws essentially no quiescent current, and effectively samples input signals at the falling edge of CK.

As with the circuit of [Tajalli III], the parallel differential transistor pair 140/141 provides additional high-frequency peaking in this embodiment and optional offset voltage compensation, as the differential pair inputs are driven by Vin+ and Vin− with a frequency response shaped by high-pass RC filters 170/180, and 171/181 having a corner frequency of $$f_z \approx \frac{1}{2\pi RC}.$$

Incremental adjustment of offset correction voltages Voc+ and Voc− may be made as necessary to adjust the balance of differential outputs Vout.

As is common practice, $f_z$ will typically be chosen to be at or near the natural high frequency falloff of the received signal amplitude vs. frequency curve to provide the desired peaking characteristic, as illustrated in FIG. 6A.

Sampler with Increased Wideband Gain

Figure 2:
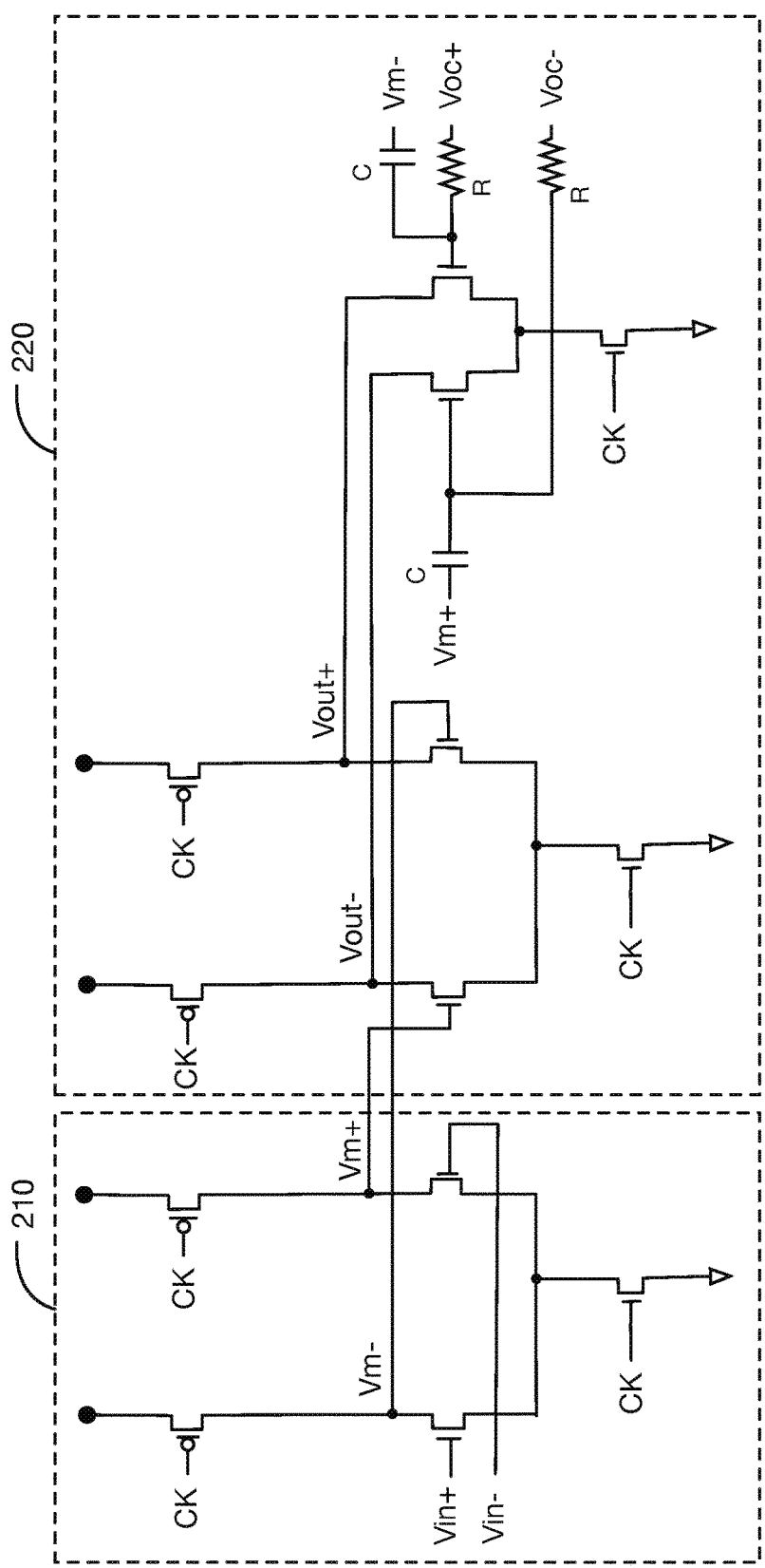
FIG. 2 is a schematic diagram of a voltage sampler embodiment with increased signal gain over a wide frequency range and offset compensation.

The same dynamic mode operation may be used in a sampling circuit with wideband gain, as shown in the schematic of FIG. 2.

Although a similar incremental-linear analysis may be applied here as in the previous example, an alternative interpretation may be of more descriptive value, especially in operational configurations where the clock frequency is significantly higher than corner frequency $f_z$. In this alternative analysis, first stage 210 effectively acts as a high frequency mixer, producing differential output signals Vm (Vm+, Vm−) which are effectively the carrier CK mixed with or modulated by differential input Vin. The Vm output is then input to the main differential pair as well as the offset correction differential pair. Second stage 220 then effectively synchronously combines the two versions, mixing Vm with CK to produce differential outputs Vout again. As the modulated carrier frequencies involved are higher than corner frequency $f_z$, the modulated signals effectively pass unaffected through capacitors C (which provide DC blocking to prevent the offset correction voltage from affecting the gates of the main differential pair), allowing both differential pairs in 220 to provide gain at all signal frequencies. By upconverting the frequency of the input voltage to be sampled, the full bandwidth of the signal Vin (in the modulated signal form Vm) may be applied to both the final differential pair, and to the offset differential pair while maintaining the DC isolation between the two differential pairs.

Figure 7:
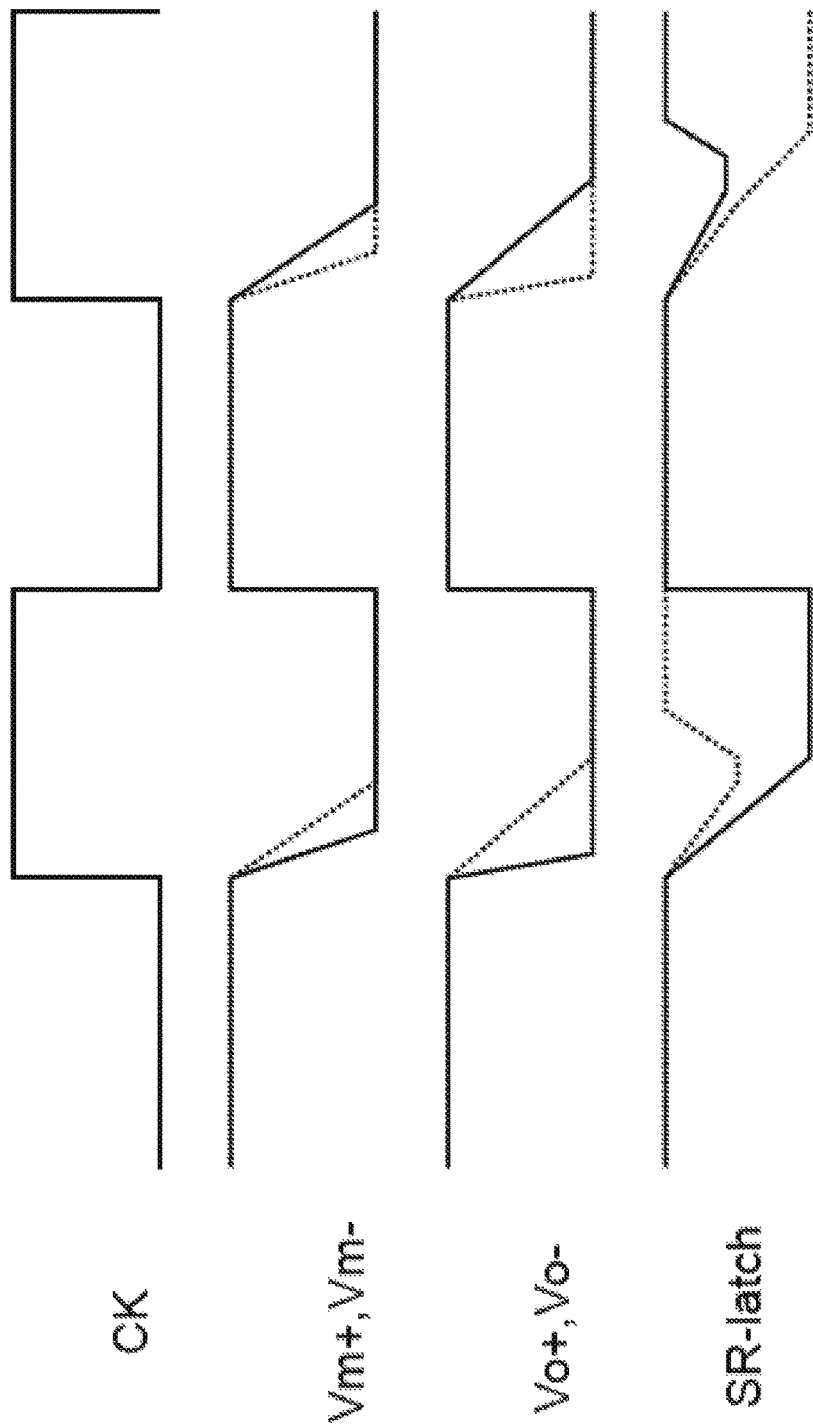
FIG. 7 is a timing diagram with respect to the circuit of FIG. 2, in accordance with some embodiments.

Referring to FIG. 2, the operation of the circuit will be described. Both Vm and Vout are reset when CK is low. When CK is high, Vin is amplified such that Vm=a×Vin and Vout=b×Vm (a and b are scalar numbers representing gain of the two stages). During the time that CK=1, Vout=a×b× Vin. An SR-latch (or any similar decision circuit) is connected to Vout, and is similarly enabled according to CK clock signal. The latch captures the value of Vout and the can determine whether the input has been high or low. Indeed, the SR-latch effectively performs the operation of demodulation or detection. In one embodiment, the resulting transfer function was seen to be effectively flat over a wide frequency range, as illustrated in FIG. 6B, with approximately 6 dB of additional gain. As in the previous example, incremental adjustment of offset correction voltages Voc+ and Voc− may be made as necessary to adjust the balance of differential outputs Vout. FIG. 7 depicts a timing diagram, in accordance with some embodiments. As shown, Vm+/− are modulated according to the CK frequency. Vo+/− represent the output signal incorporating wideband gain, due to the entirety of Vm+/− passing through the capacitors. Vout+/− may then latched, using an SR latch for example, to provide a demodulated output.

In summary, the offset correction performed in the second stage is leveraged so as to provide either a wideband gain enhancement or alternatively a narrow band equalization.

In some embodiments, a method includes applying a differential signal voltage Vin at the differential inputs of a first sampling stage of a sampling circuit, applying a clocking signal CK to the first sampling stage to generate a modulated signal Vm representing a sample of the differential signal voltage, the modulated signal Vm being output at intermediate nodes of the first sampling circuit, discharging pre-charged sampling output nodes Vout by applying the modulated signal Vm to a differential input of a second sampling stage of the sampling circuit, further discharging the pre-charged sampling output nodes Vout with an offset current provided by a differential transistor pair of an offset correction circuit driven by Voc, further discharging the pre-charged sampling output nodes Vout by applying the modulated signal Vm to the differential input of the differential transistor pair of the offset correction circuit, and latching output node values of the sampling output nodes.

In some embodiments, the first sampling circuit is a differential pair of transistors, wherein applying the differential signal voltage at the differential inputs is performed after the differential output nodes of the differential pair of transistors have been pre-charged.

Sampler with Extended Evaluation Time

In switched dynamic circuits such as that of FIG. 2, the static voltage of internal nodes such as Vm+ and Vm− are dependent not only on the transistor action of the differential pair, but also on the integrating action of the distributed node capacitance on the charge transferred on CK transitions. This integrating behavior can become significant, especially when multiple dynamically clocked stages are cascaded as in this example.

Figure 3A:
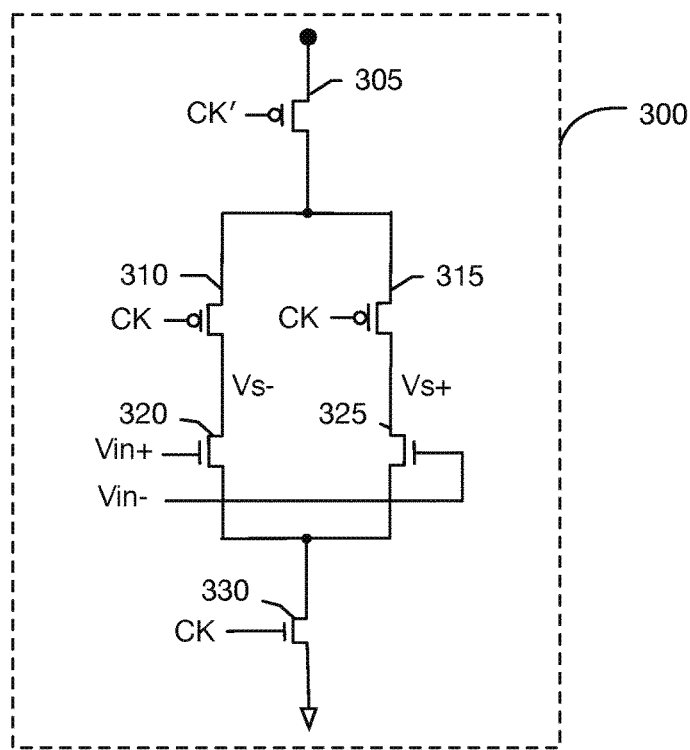
FIGS. 3A and 3B are schematic diagrams of embodiments of a dynamic mode CMOS sampling circuit allowing an extended input signal evaluation time.
Figure 3A:
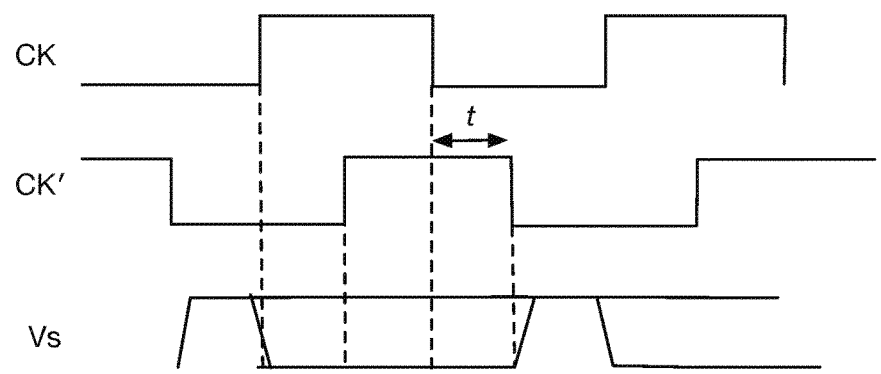

FIG. 3A shows the schematic diagram of a sampler, in which two partially overlapping clocks CK and CK' are used to obtain extended input evaluation time. As such, the following stage, which may be an SR latch for example, will have a relaxed speed requirement. For descriptive purposes without implying a limitation, CK and CK' in this explanation are assumed to have an approximate quadrature relationship, as shown in the timing diagram of FIG. 3A. In practice, both clocks may be generated by a multiphase clock generator, or one clock may be synthesized from the other using a delay element, such as an inverter chain. During the first 90 degrees of the clock cycle, the sampler is reset using a reset circuit by turning on the PMOS FETS 310/315 that charge the differential output nodes to the supply voltage. As shown in FIG. 3A, reset circuit includes a differential pair of PMOS transistors 310/315 each receiving a sampling signal which may take the form of a clock signal CK, and a PMOS transistor 305 acting as a current source receiving a second clock CK'. On the rising edge of CK (during the second 90 degrees of the clock cycle), a sampling interval begins, and the differential output voltage Vs+/Vs− takes on differential output levels proportionate to the voltage levels seen at inputs of NMOS transistors 320/325 receiving Vin+ and Vin−, respectively. As shown, one of the output nodes will discharge faster than the other output node, forming a differential voltage output Vs+/Vs−. The differential output voltage remains unchanged while either CK or CK' is high. Specifically, in the third 90 degree portion, the addition of the top PMOS FET 305 driven by the quadrature (or otherwise delayed) clock CK' prevents the recharge/reset cycle that would have otherwise occurred when CK returns low, terminating the sampling interval (turning off the tail current at the bottom and turning on the middle PMOS FETs to recharge Vs). The reset cycle initiates after an opposite transition (shown as a negative edge) of CK' in conjunction with CK being low during the final 90 degrees, and the output nodes Vs+ and Vs− are pre-charged to high levels. Thus, the voltage sample occurs at the rising edge of CK, and is maintained through the falling edge of CK' (rather than merely the falling edge of CK). This extended output duration provides increased set-up time for a subsequent integrator/sampler or latch element. It should be noted that the architecture of FIG. 3A should not be considered limiting, as the transistor architecture may be reversed. In FIG. 3A, the extension of the evaluation time stems from the reset cycle being delayed by the staggered nature of the sampling signal CK and the phase-offset signal CK'. In FIG. 3A the reset cycle is terminated in response to a rising-edge transition of CK, while a subsequent reset cycle is initiated in response to a falling-edge transition of CK'. In an embodiment with reversed architecture (e.g., NMOS transistors replacing PMOS transistors 305/310/315 in the reset circuit, and PMOS transistors replacing the NMOS transistors 320/325/330 in the differential output circuit), the opposite may hold true: the reset cycle may terminate in response to a falling edge transition of clock CK with the subsequent reset cycle initiating in response to a rising edge transition of clock CK'.

In some embodiments, an apparatus includes a reset circuit configured to receive a first clock signal CK and a second clock signal CK', wherein a phase of the second clock signal is delayed with respect to a phase of the first clock signal. The reset circuit is configured to charge a pair of output nodes at Vs+ and Vs− during a reset cycle, wherein the reset circuit terminates the reset cycle in response to a transition of the first clock signal CK, and initiates a subsequent reset cycle in response to an opposite transition of the second clock signal CK', and a differential output circuit configured to generate a differential voltage output Vs+/− in response to receiving a differential input signal Vin+/−, the differential voltage output generated by discharging an output node of the pair of output nodes via a current sink enabled by the transition of the first clock signal CK, the discharged output node determined by the received differential input signal Vin+/−.

In some embodiments, the phase of the second clock signal is delayed by 90 degrees with respect to the phase of the first clock signal. In some embodiments, the reset circuit comprises a plurality of transistors. In some embodiments, the plurality of transistors are PMOS transistors. In some embodiments, the transition of the first clock signal is a rising-edge transition, and wherein the opposite transition of the second clock signal is a falling-edge transition. Alternatively, the plurality of transistors may be NMOS transistors. In such embodiments, the transition of the first clock signal is a falling-edge transition, and wherein the opposite transition of the second clock signal is a rising-edge transition.

In some embodiments, the reset circuit comprises a current source enabled by the opposite transition of the second clock signal.

In some embodiments, the apparatus further includes a multiphase clock generator for generating the first and second clock signals. Alternatively, the apparatus may include a delay element for generating the second clock signal based on the first clock signal. In some embodiments, the apparatus includes a latch configured to sample the differential voltage output. The latch may be an SR latch or one of various other types of well-known latches. In some embodiments, the latch may include an integrator.

In some embodiments, a method includes receiving, at a reset circuit, a first clock signal CK and a second clock signal CK', wherein a phase of the second clock signal CK' is delayed with respect to a phase of the first clock signal CK. A pair of output nodes are pre-charged during a reset cycle. The reset cycle may be terminated in response to a transition of the first clock signal CK, and a subsequent reset cycle may be initiated in response to an opposite transition of the second clock signal CK'. A differential voltage output may be generated in response to receiving a differential input signal Vin+/Vin−, the differential voltage output generated by discharging an output node of the pair of output nodes via a current sink enabled by the transition of the first clock signal CK.

In some embodiments, a sampling device having an extended output duration includes a sampler configured to form a differential output voltage Vs+/Vs−, the sampler comprising a current source 330 configured to receive a sampling signal CK, the current source 330 configured to initiate a sampling interval by enabling the current source 330 according to a first transition of the received sampling signal CK and terminate the sampling interval by disabling the current source 330 according to a second transition of the received sampling signal CK. The sampler further includes a differential transistor pair including transistors 320 and 325 connected to the current source 330, the differential transistor pair configured to receive a differential input signal Vin+/Vin− and to responsively form the differential voltage output Vs+/Vs− at a pair of output nodes based on current drawn by the current source 330 during the sampling interval. The sampling apparatus may further include a reset circuit connected to the pair of output nodes, the reset circuit configured to pre-charge the pair of output nodes prior to initiation of the sampling interval, and to inhibit a recharge of the pair of output nodes for a hold time t after termination of the sampling interval and prior to initiation of a subsequent sampling interval. As shown in FIG. 3A, the reset circuit includes a pair of transistors 310/315 connected to the pair of output nodes and to a reset-inhibition transistor 305, each transistor in the pair of transistors 310/315 configured to receive clock signal CK and to couple the pair of output nodes to the reset-inhibition transistor 305 after termination of the sampling interval. The reset-inhibition transistor 305 is further connected to a charging source, the reset-inhibition transistor 305 configured to receive a phase-offset clock signal CK' having a phase offset with respect to the clock signal CK. The delayed/phase offset signal CK' may be generated using any one of various methods. For example, an inverter chain may be configured to receive the clock signal CK and to responsively generate the delayed version (phase offset) of CK due to propagation delays. Alternatively, CK and CK' may be different phases of a clock signal obtained via a phase-locked loop, voltage-controlled oscillator, or various other devices for creating multiple phases of a clock signal. The reset-inhibition transistor 305 is configured to inhibit the recharge of the pair of output nodes by preventing current flow from the charging supply to the pair of transistors 310/315 during the hold time t. As shown in FIG. 3A, the hold time t corresponding to the phase offset.

Figure 3B:
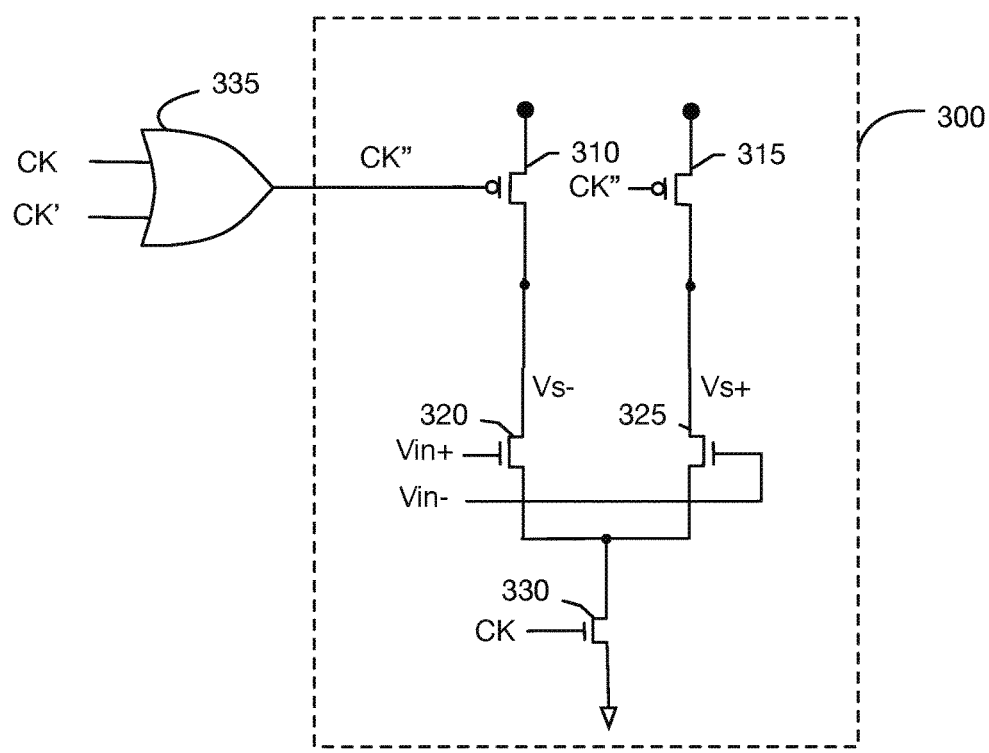
Figure 3B:
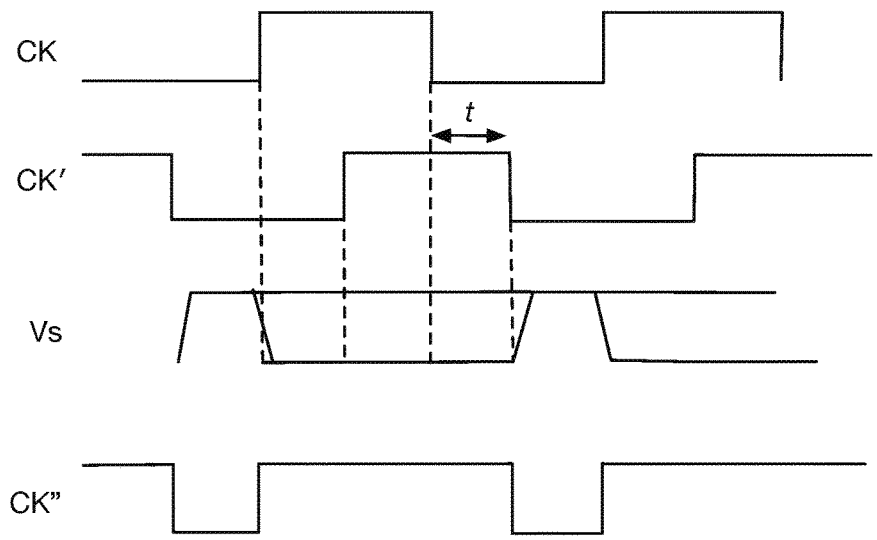

While FIG. 3A illustrates a reset circuit having pair of transistors 310/315 and reset-inhibition transistor 305, it should be noted other reset circuits may be utilized to inhibit recharging of the output nodes. FIG. 3B illustrates an alternative embodiment of a reset circuit, where the reset circuit comprises the differential pair of transistors 310/315 connected directly to the charging supply and to the pair of output nodes. As shown, the differential pair of transistors 310/315 each receive a single reset-enable signal CK" from a reset-enable signal generator, which may include XOR 335, in accordance with some embodiments. In such embodiments, XOR 335 may be configured to XOR the sampling signal CK with the delayed version of the sampling signal CK'. The resulting waveform CK" is shown at the bottom of FIG. 3B. It should be noted that the reset-enable signal CK" does not have to be formed using phase-offset clock signals. In some embodiments, the reset-enable signal generator may generate a reset-enable signal that is a periodic signal having a duty cycle that is not equal to 50%. In such embodiments, the duty-cycle may be greater than 50% (in the case that transistors 310/315 are PMOS) or less than 50% (in the case that the transistors 310/315 are NMOS). In alternative embodiments, the reset-enable signal may not be a periodic signal, and an external control processor may determine when to enable transistors 310/315 to recharge the pair of output nodes. In some embodiments, a reset-enable signal generator may obtain the sampling signal, and may form a corresponding reset-enable signal to inhibit recharging of the output nodes at the end of the sampling interval to extend the differential voltage output for the hold time t). In some embodiments, the reset-enable signal may not be a periodic signal, and an external control processor may determine when to enable transistors 310/315 to recharge the pair of output nodes.

Figure 12:
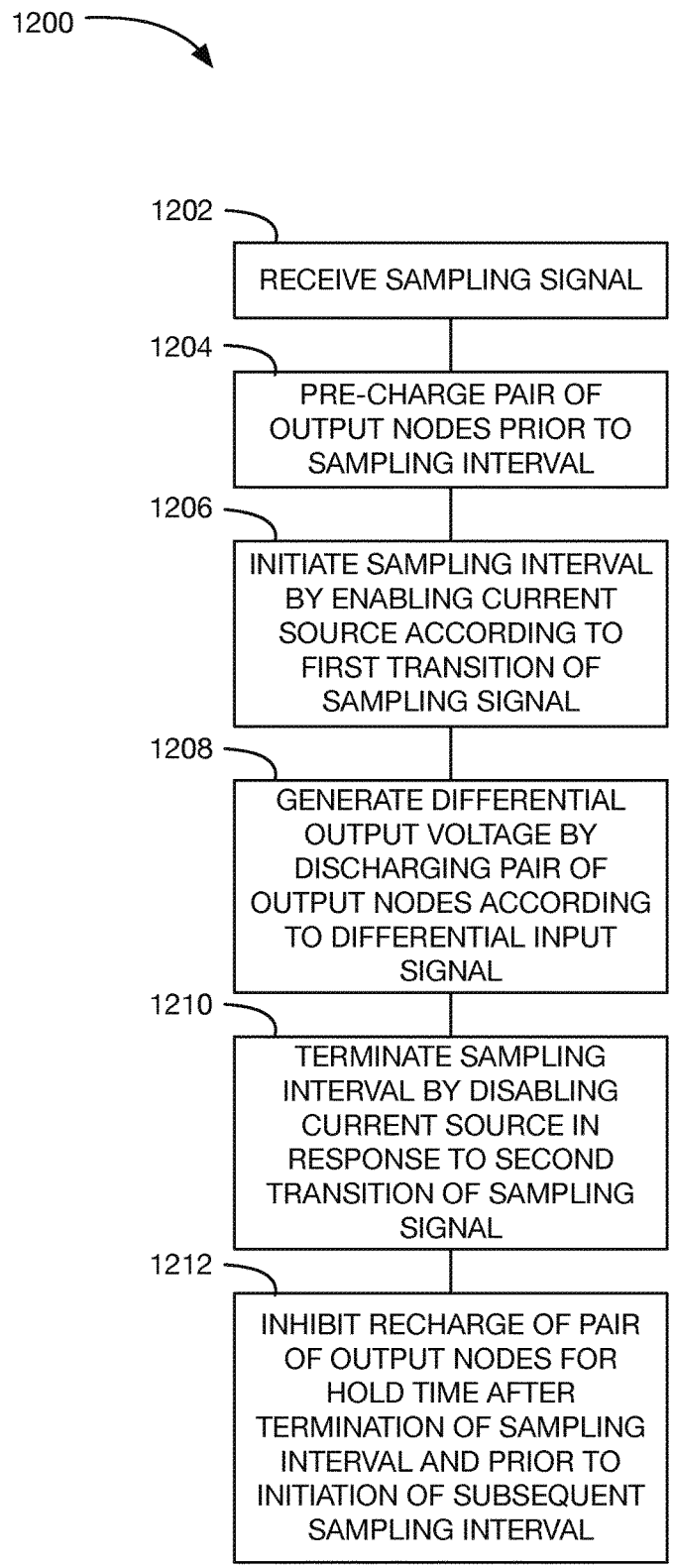
FIG. 12 is a flowchart of a method, in accordance with some embodiments.

FIG. 12 is a flowchart of a method 1200, in accordance with some embodiments. As shown, method 1200 includes receiving a sampling signal at block 1202. At block 1204, a pair of output nodes are pre-charged prior to a sampling interval. At block 1206, the sampling interval is initiated by enabling a current source according to a first transition of the received sampling signal. Responsively, a differential output voltage is generated 1208 at the pair of output nodes by discharging the pair of output nodes according to a differential input signal, the pair of output nodes discharged according to current drawn by the current source during the sampling interval. The sampling interval is terminated 1210 by disabling the current source in response to a second transition of the received sampling signal, and a recharge of the pair of output nodes is inhibited 1212 for a hold time after termination of the sampling interval and prior to initiation of a subsequent sampling interval.

In some embodiments, the first transition is a rising-edge transition and wherein the second transition is a falling-edge transition. Alternatively, the first transition may be a falling-edge transition and wherein the second transition is a rising-edge transition.

In some embodiments, as shown in FIG. 3A, the received sampling signal corresponds to a clock signal. In such embodiments, the method may further include coupling the pair of output nodes to a reset-inhibition transistor after termination of the sampling interval via a pair of transistors, each transistor in the pair of transistors receiving the clock signal, receiving, at the reset-inhibition transistor, a phase-offset clock signal having a phase offset with respect to the clock signal, and inhibiting the recharge of the pair of output nodes by preventing current flow from a charging supply to the pair of output nodes via the pair of transistors during the hold time, the hold time corresponding to the phase offset. The clock signal and phase-offset clock signal may be generated using a clock signal generator.

In some embodiments, as shown in FIG. 3B, inhibiting the recharge of the pair of output nodes comprises receiving a reset-enable at a pair of reset-inhibition transistors, and pre-charging the pair of output nodes according to the reset-enable signal. In such embodiments, the reset-enable signal is generated using a reset-enable signal generator. In some embodiments, the reset-enable signal is generated by XOR'ing the sampling signal and a delayed version of the sampling signal. In some embodiments, the method 1200 further includes latching the differential output voltage.

Cascades of Clocked Samplers

Figure 4:
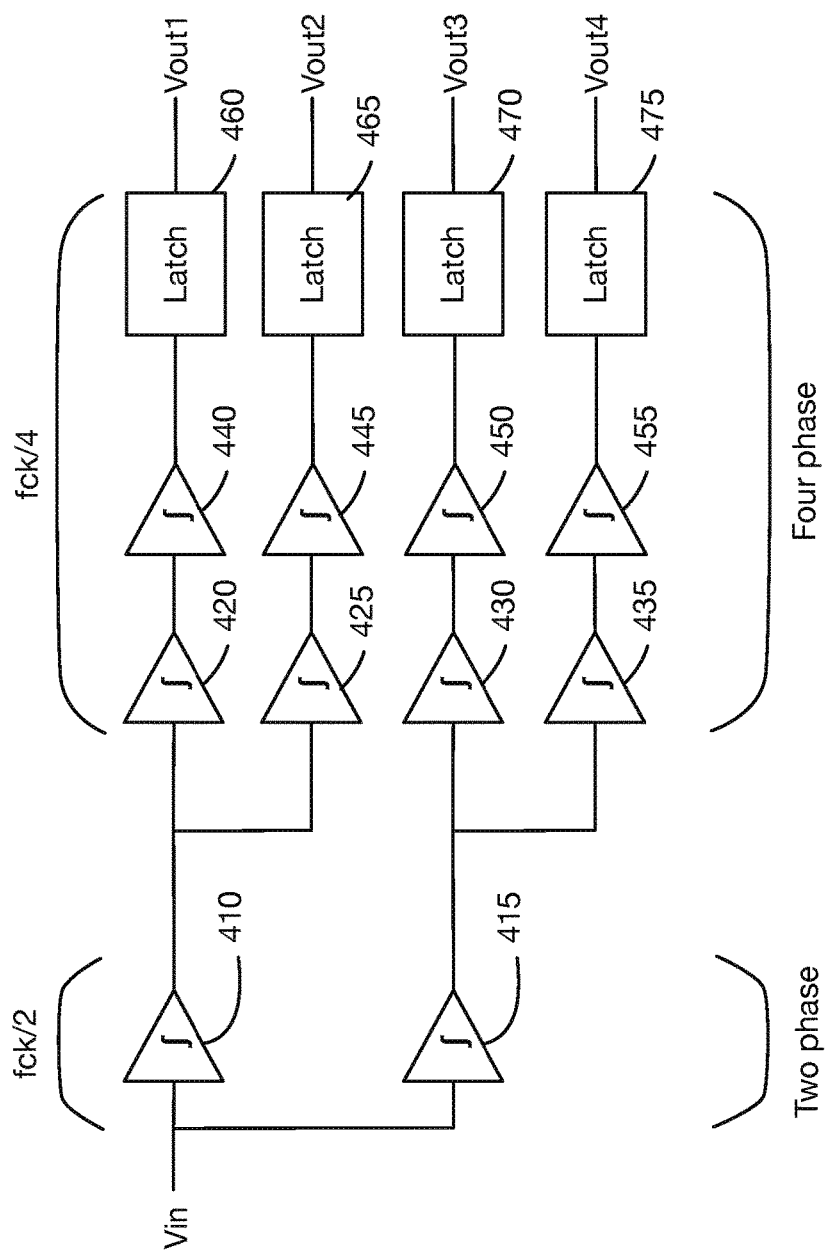
FIG. 4 is a block diagram showing a cascade of sampling integrator/amplifiers acting upon a single input signals and producing four results suitable for processing in four phases.

Clocked samplers with the described functionality are amenable to cascaded operation, as in the embodiment shown in the block diagram of FIG. 4. Input signal Vin is sampled at 410 and 415 by samplers operating on complementary phases of a two-phase sampling clock at frequency Fck/2. The resulting sampled results are each themselves sampled twice, by samplers operating on complementary phases of sampling clocks at frequency Fck/4. That is, each sampled result provided by 410 is alternately sampled by 420 or by 425 (as their sampling clock operates at one half the rate of the previous sample clock). Similarly, each sampled result provided by 415 is alternately sampled by 430 or by 435. The four results thus obtained are again sampled at 440, 445, 450, and 455, and those ultimate sampled results are digitally latched at 460, 465, 470, 475 to produce digital outputs Vout1, Vout2, Vout3, and Vout4.

In practical embodiments, splitting data processing between two phase operation with its simple clocking regime, and four- (or greater) phase operation with its relaxed latency provides a useful tradeoff between power, speed, and complexity. Such cascaded samplers may be designed for any arbitrary number of resultant phases using known art clock division and/or clock steering logic, thus neither "two phase" nor "four phase" should be considered limiting in this description.

Figure 5:
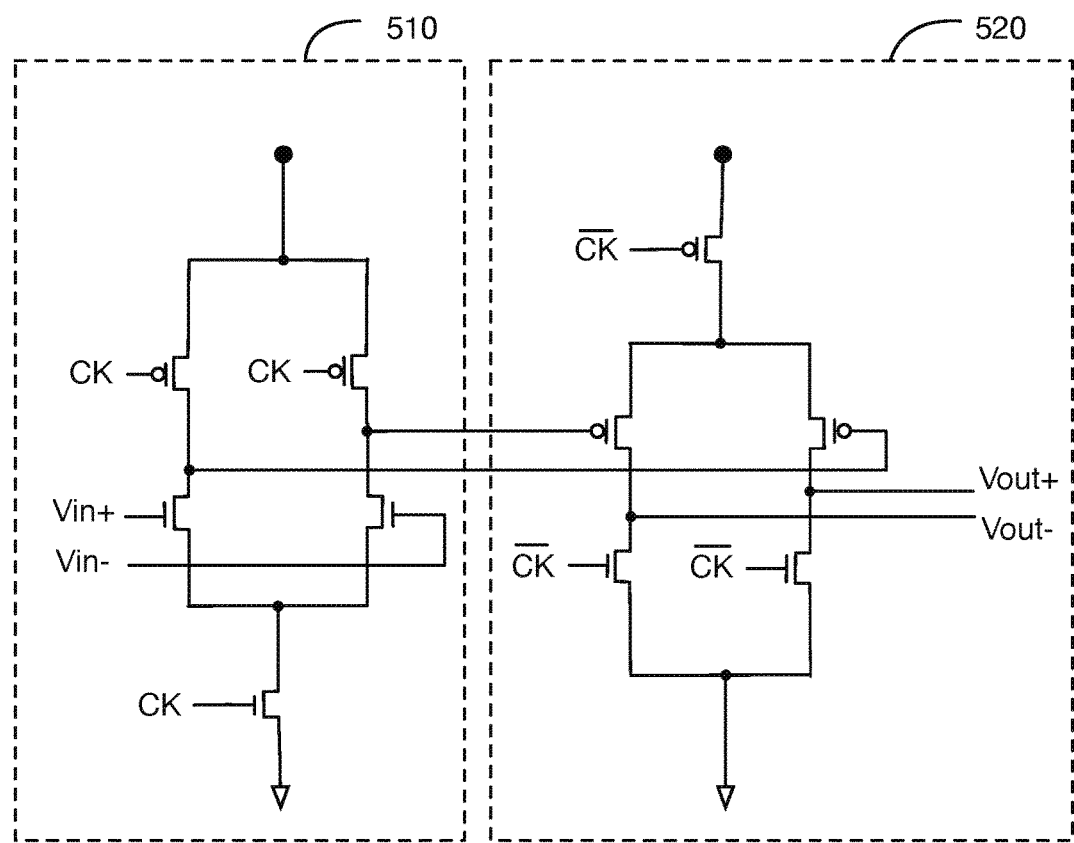
FIG. 5 is a schematic showing one embodiment of a dynamic mode CMOS self retimed integrator suitable for use as the samplers/integrators of FIG. 4.

FIG. 5 is a schematic diagram of one embodiment of a CMOS sampler/integrator particularly well suited to cascaded operation as in FIG. 4. Input clock CK and its compliment C'K' control first sampler stage 510 and second sampler stage 520 respectively. In practice, this alternation of complementary stages provides an advantageous self-retiming behavior that simplifies clocking where there are two or more consecutive stages of such sampler/integrators. Such cascaded sampler architectures also allow significant gain to be obtained; in one embodiment, 27 dB of gain was obtained from a series of such stages with only 0.5 mV of RMS noise.

Figure 8:
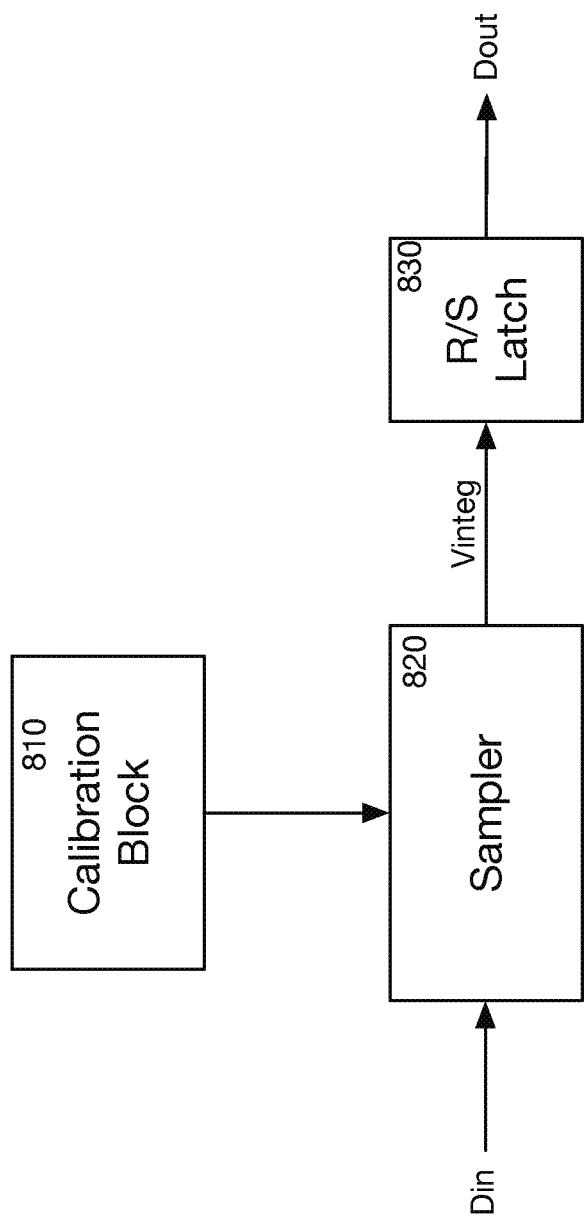
FIG. 8 is a block diagram of an integrating sampler, including a calibration circuit and an output latch.
Figure 11:
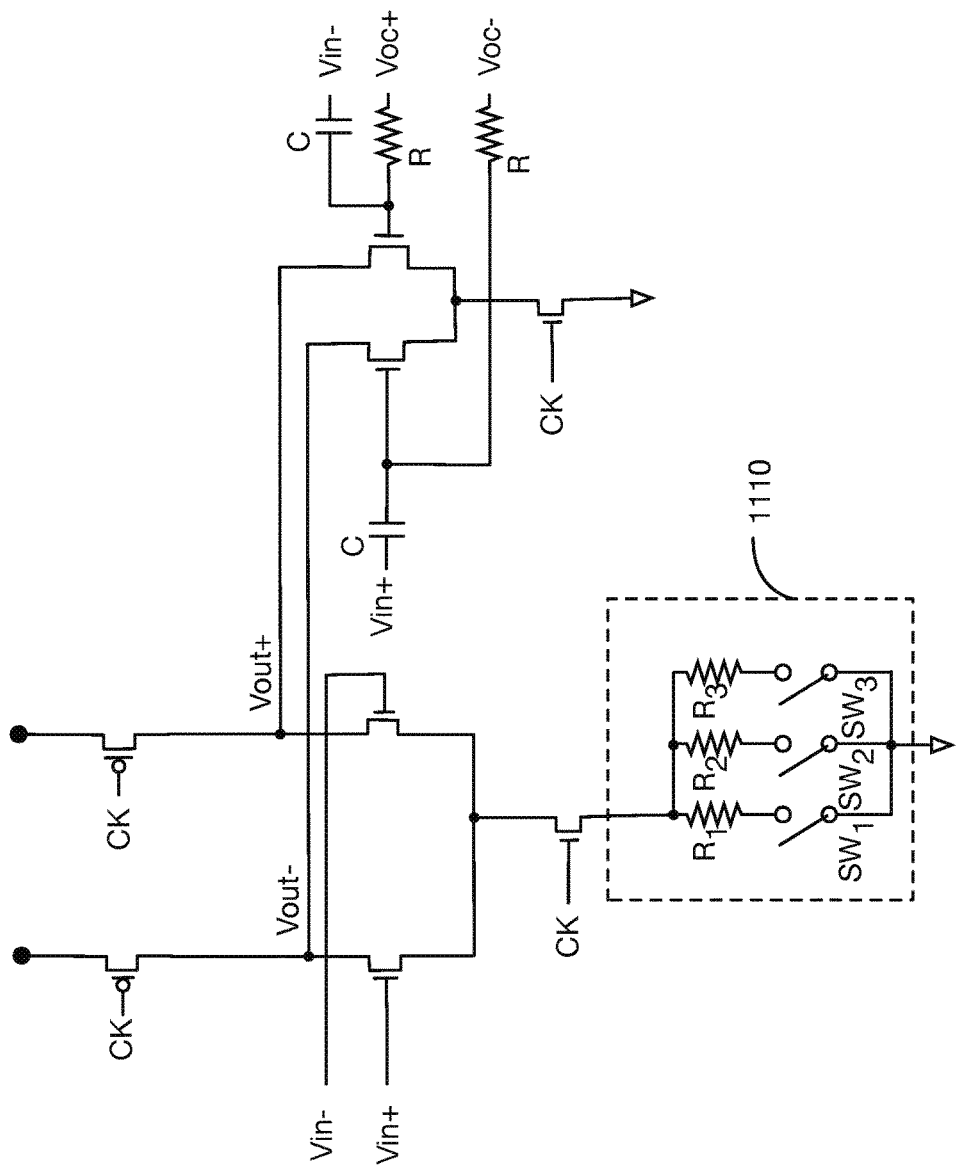
FIG. 11 is a circuit providing an adjustable filter to set a frequency cutoff for high-frequency peaking.

FIG. 8 shows a block diagram of a sampler 820 that that includes a calibration block 810 to adjust an integration period of the sampler. The output of the sampler is latched by RS latch 830 that may use positive feedback to drive the latch based on the differential input developed by the sampler. A more detailed version of the calibration circuit is depicted in FIG. 11, which includes a switched resistor bank that may be adjusted so as to control the amount of current that is discharged from the sampler. The lower the current (corresponding to increased resistance), the longer the input signal may be sampled to drive the discharge currents. A desired tradeoff between speed and noise cancellation may be achieved by controlling the integration period.

As shown, in FIG. 11, a switched resistor bank 1110 adjusts an amount of current being drawn through the circuit. By drawing higher currents, the differential voltage Vout+/Vout− on the output nodes will form quickly by discharging the output nodes faster. Conversely, drawing a lower current will cause the output nodes to discharge slower, and the differential voltage Vout+/Vout− will form slowly. As sampling rates increase, widths of eyes in the eye diagram become narrower in width for a given sampling interval, representing a shorter amount of time to sample the output voltage during the sampling interval. In such embodiments, it may be desirable to lower the resistance of resistor bank 1110 in order to provide a higher current through the circuit, such that the differential output voltage appears quickly. Similarly, for a lower sampling rate, the eyes will widen in width, and a higher resistance may be selected in order to draw less current, thus discharging the output nodes slowly.

In some embodiments, an apparatus includes a sampler having a differential pair configured to receive a differential input voltage, the differential pair connected to a differential output node for providing a differential output voltage. The apparatus may further include a current source configured to form the differential output voltage at the output nodes by discharging the output nodes according to the received input voltage. As shown in FIG. 11, the current source includes a transistor receiving an enable signal (depicted as clock signal CK), the transistor configured to enable the current drawn through the differential pair. The current source further includes a switched-resistor bank 1110 connected to the transistor, the switched-resistor bank configured to adjust the current drawn through the differential pair by adjusting an impedance. As current and resistance are inversely related by Ohm's law, as the resistance of resistor bank 1110 increases, the draw current will decrease, and vice versa. In some embodiments, the apparatus may further include a voltage offset correction circuit connected to the output nodes. In such embodiments, the voltage offset correction circuit may provide high-frequency peaking as shown in FIG. 11 and described above. In some embodiments, the apparatus is configured to pre-charge the output nodes according to a clock signal received at PMOS FETs, and a sampling interval initiating discharge of the output nodes is initiated according to the clock signal received at the NMOS FET in the current source. It will be further apparent that the transistor architectures may be switched, as well as additional ways of performing the sampling/reset intervals.

Figure 9:
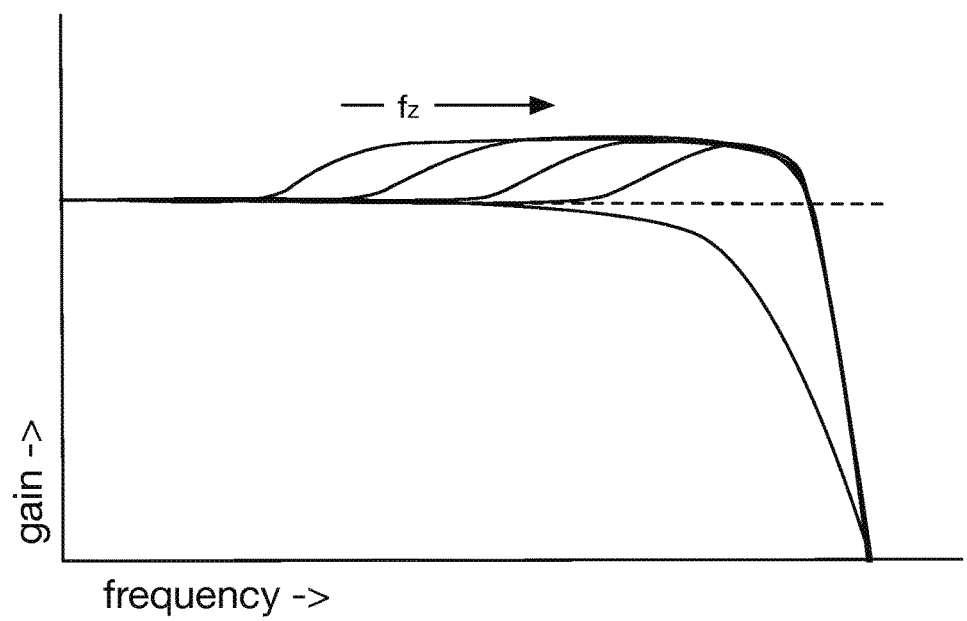
FIG. 9 is a gain vs. frequency plot showing an adjustable high-frequency peaking.
Figure 10:
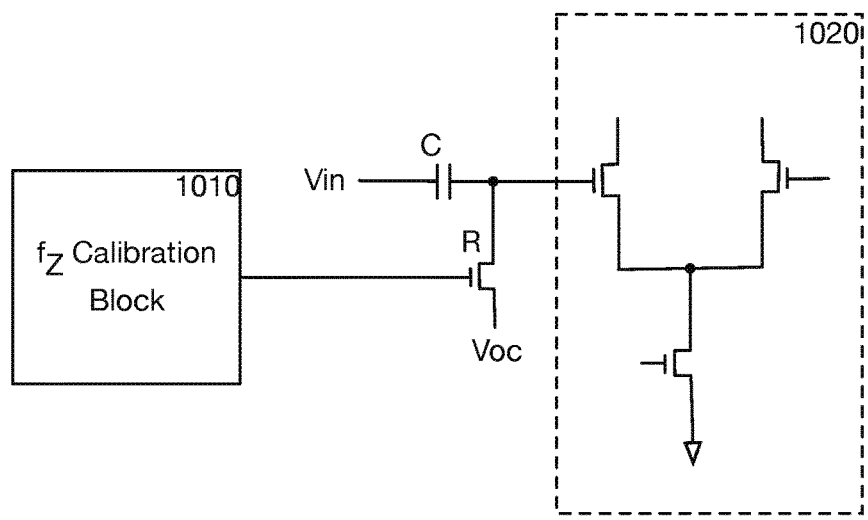
FIG. 10 is a circuit to provide an integration calibration.

FIG. 10 depicts a circuit that may be used to tune the frequency at which the high-frequency peaking is coupled to the supplemental differential pair (such as differential pair 140, 141 in FIG. 1). That is, each of the resistors 180, 181 may be implemented as shown in FIG. 10 using a FET in triode mode acting as an adjustable resistance. The effects of the adjustment are depicted in FIG. 9.

The invention claimed is:

1. A method comprising:
receiving a sampling signal;
pre-charging a pair of output nodes prior to a sampling interval;
initiating the sampling interval by enabling a current source according to a first transition of the received sampling signal;
generating a differential output voltage at the pair of output nodes by discharging the pair of output nodes according to a differential input signal, the pair of output nodes discharged according to current drawn by the current source during the sampling interval;
terminating the sampling interval by disabling the current source in response to a second transition of the received sampling signal; and
inhibiting a recharge of the pair of output nodes for a hold time after termination of the sampling interval and prior to initiation of a subsequent sampling interval.

2. The method of claim 1, wherein the first transition is a rising-edge transition and wherein the second transition is a falling-edge transition.

3. The method of claim 1, wherein the first transition is a falling-edge transition and wherein the second transition is a rising-edge transition.

4. The method of claim 1, further comprising:
coupling the pair of output nodes to a reset-inhibition transistor after termination of the sampling interval via a pair of transistors, each transistor in the pair of transistors receiving the sampling signal;
receiving, at the reset-inhibition transistor, a phase-offset signal having a phase offset with respect to the sampling signal; and
inhibiting the recharge of the pair of output nodes by preventing current flow from a charging supply to the pair of output nodes via the pair of transistors during the hold time, the hold time corresponding to the phase offset.

5. The method of claim 4, wherein the received sampling signal and phase-offset signal are clock signals.

6. The method of claim 5, further wherein the clock signals are generated by a clock signal generator.

7. The method of claim 1, wherein inhibiting the recharge of the pair of output nodes comprises receiving a reset-enable at a pair of reset-inhibition transistors, and pre-charging the pair of output nodes according to the reset-enable signal.

8. The method of claim 7, wherein the reset-enable signal is generated using a reset-enable signal generator.

9. The method of claim 8, wherein the reset-enable signal generator comprises an XOR gate for generating the reset-enable signal by XOR'ing the sampling signal and a delayed version of the sampling signal.

10. The method of claim 1, further comprising latching the differential output voltage.

11. An apparatus comprising:
a sampler configured to form a differential output voltage at a pair of output nodes, the sampler comprising:
a current source configured to receive a sampling signal, the current source configured to initiate a sampling interval by enabling the current source according to a first transition of the received sampling signal and terminate the sampling interval by disabling the current source according to a second transition of the received sampling signal; and
a differential transistor pair connected to the current source and to the pair of output nodes, the differential transistor pair configured to receive a differential input signal and to responsively form the differential voltage output at the pair of output nodes based on current drawn by the current source during the sampling interval; and
a reset circuit connected to the pair of output nodes, the reset circuit configured to pre-charge the pair of output nodes prior to initiation of the sampling interval, and to inhibit a recharge of the pair of output nodes for a hold time after termination of the sampling interval and prior to initiation of a subsequent sampling interval.

12. The apparatus of claim 11, wherein the first transition is a rising-edge transition and wherein the second transition is a falling-edge transition.

13. The apparatus of claim 11, wherein the first transition is a falling-edge transition and wherein the second transition is a rising-edge transition.

14. The apparatus of claim 11, wherein the reset circuit comprises:
- a pair of transistors connected to the pair of output nodes and to a reset-inhibition transistor, each transistor in the pair of transistors configured to receive the sampling signal and to couple the pair of output nodes to the reset-inhibition transistor after termination of the sampling interval; and
- the reset-inhibition transistor further connected to a charging source, the inhibiting transistor configured to receive a phase-offset signal having a phase offset with respect to the sampling signal, the inhibiting transistor configured to inhibit the recharge of the pair of output nodes by preventing current flow from the charging supply to the pair of output nodes via the pair of transistors during the hold time, the hold time corresponding to the phase offset.

15. The apparatus of claim 14, wherein the received sampling signal and phase-offset signal are clock signals.

16. The apparatus of claim 15, further comprising a clock signal generator configured to generate the clock signal and the phase-offset clock signal.

17. The apparatus of claim 11, wherein the reset circuit comprises a pair of reset-inhibition transistors connected to the pair of output nodes and a charging supply, the reset-inhibition transistors configured to receive a reset-enable signal and to pre-charge the pair of output nodes according to the reset-enable signal.

18. The apparatus of claim 17, further comprising a reset-enable signal generator configured to generate the reset-enable signal.

19. The apparatus of claim 18, wherein the reset-enable signal generator comprises a logical XOR configured to receive the sampling signal and a delayed version of the sampling signal, and to responsively generate the reset-enable signal.

20. The apparatus of claim 11, further comprising a latch configured to latch the differential output voltage.

* * * * *